(12) United States Patent
Liu

(10) Patent No.: US 8,883,535 B2
(45) Date of Patent: Nov. 11, 2014

(54) MICROELECTROMECHANICAL SYSTEM DEVICES HAVING THROUGH SUBSTRATE VIAS AND METHODS FOR THE FABRICATION THEREOF

(71) Applicant: Lianjun Liu, Chandler, AZ (US)

(72) Inventor: Lianjun Liu, Chandler, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 0 days.

(21) Appl. No.: 13/781,391

(22) Filed: Feb. 28, 2013

(65) Prior Publication Data

US 2014/0239423 A1    Aug. 28, 2014

(51) Int. Cl.
*H01L 21/00* (2006.01)
*B81B 3/00* (2006.01)
*B81C 1/00* (2006.01)

(52) U.S. Cl.
CPC ........... *B81C 1/00793* (2013.01); *B81B 3/0075* (2013.01)
USPC .......... 438/50; 73/504.12; 257/222; 257/416; 257/417; 257/704; 438/48; 438/51; 438/52; 438/53; 438/638; 438/667; 438/713

(58) Field of Classification Search
CPC .. H01L 29/84; H01L 23/481; H01L 21/76898
USPC ........ 257/222, 416, 417, 704; 438/48, 50, 51, 438/52, 53, 638, 667, 713; 73/504.12
See application file for complete search history.

(56) References Cited

U.S. PATENT DOCUMENTS

| 6,033,991 A * | 3/2000 | Ramkumar et al. .......... 438/713 |
| 6,936,918 B2 * | 8/2005 | Harney et al. ................. 257/704 |
| 7,081,647 B2 * | 7/2006 | Mushika ....................... 257/222 |
| 8,105,941 B2 * | 1/2012 | Huang .......................... 438/638 |
| 2010/0133630 A1 * | 6/2010 | Scheuerer et al. ............ 257/417 |

* cited by examiner

*Primary Examiner* — Meiya Li
*Assistant Examiner* — Peter M Albrecht
(74) *Attorney, Agent, or Firm* — Ingrassia, Fisher & Lorenz, P.C.

(57) ABSTRACT

Methods for the fabrication of a Microelectromechanical Systems ("MEMS") device are provided. In one embodiment, the MEMS device fabrication method includes forming a via opening extending through a sacrificial layer and into a substrate over which the sacrificial layer has been formed. A body of electrically-conductive material is deposited over the sacrificial layer and into the via opening to produce an unpatterned transducer layer and a filled via in ohmic contact with the unpatterned transducer layer. The unpatterned transducer layer is then patterned to define, at least in part, a primary transducer structure. At least a portion of the sacrificial layer is removed to release at least one movable component of the primary transducer structure. A backside conductor, such as a bond pad, is then produced over a bottom surface of the substrate and electrically coupled to the filled via.

16 Claims, 7 Drawing Sheets

MICROELECTROMECHANICAL SYSTEM DEVICES HAVING THROUGH SUBSTRATE VIAS AND METHODS FOR THE FABRICATION THEREOF

TECHNICAL FIELD

Embodiments of the present invention relate generally to microelectronic devices and, more particularly, to Microelectromechanical System ("MEMS") devices having through substrate vias, as well as to methods for the fabrication of such MEMS devices.

BACKGROUND

Microelectromechanical Systems ("MEMS") devices are employed as actuators and sensors in a wide variety of applications. Capacitive-sensing MEMS devices, for example, are now commonly employed in many different electronic devices to sense acceleration, vibration, device orientation, and other inertia-related parameters. Such MEMS devices function by sensing changes in capacitance between electrodes in a transducer structure. The transducer structure may include, for example, a number of stationary electrodes or "fingers" interposed with and spaced apart from a number of movable electrodes or "fingers" in a comb-type arrangement. The movable electrodes are rigidly joined to a larger movable structure commonly referred to as a "proof mass," which is resiliently suspended over an underlying substrate. During operation of the MEMS device in an example, a voltage differential is applied across the stationary or movable electrodes. As the proof structure moves in response to acceleration of the MEMS device, the movable electrodes are displaced with respect to the fixed electrodes and the capacitances between the electrodes vary accordingly. By monitoring these capacitances, the acceleration or other movement of the MEMS device can be determined.

Interconnect lines route electrical signals from the electrodes of the transducer structure to bond pads or other contacts located on the exterior of the MEMS device. Depending upon the particular manner in which the MEMS device is fabricated, the bond pads may be formed on laterally-projecting ledges of the MEMS device referred to as "bond pad shelves." Such an arrangement is often employed in implementations wherein the MEMS device includes a cover piece or cap, which sealingly encloses the transducer structure to prevent environmental contamination thereof. In one common package architecture, the bond pads of the MEMS device are electrically connected to a MEMS-monitoring circuit, such as an application specific integrated circuit, packaged with the MEMS device. In implementations wherein the bond pads are formed on bond pad shelves and, therefore, disposed at an elevation between the upper and lower surfaces of the MEMS device, wire bonding is typically required to form the desired electrical connections between MEMS bond pads and the MEMS-monitoring circuit.

BRIEF DESCRIPTION OF THE DRAWINGS

At least one example of the present invention will hereinafter be described in conjunction with the following figures, wherein like numerals denote like elements, and.

Figure 1:
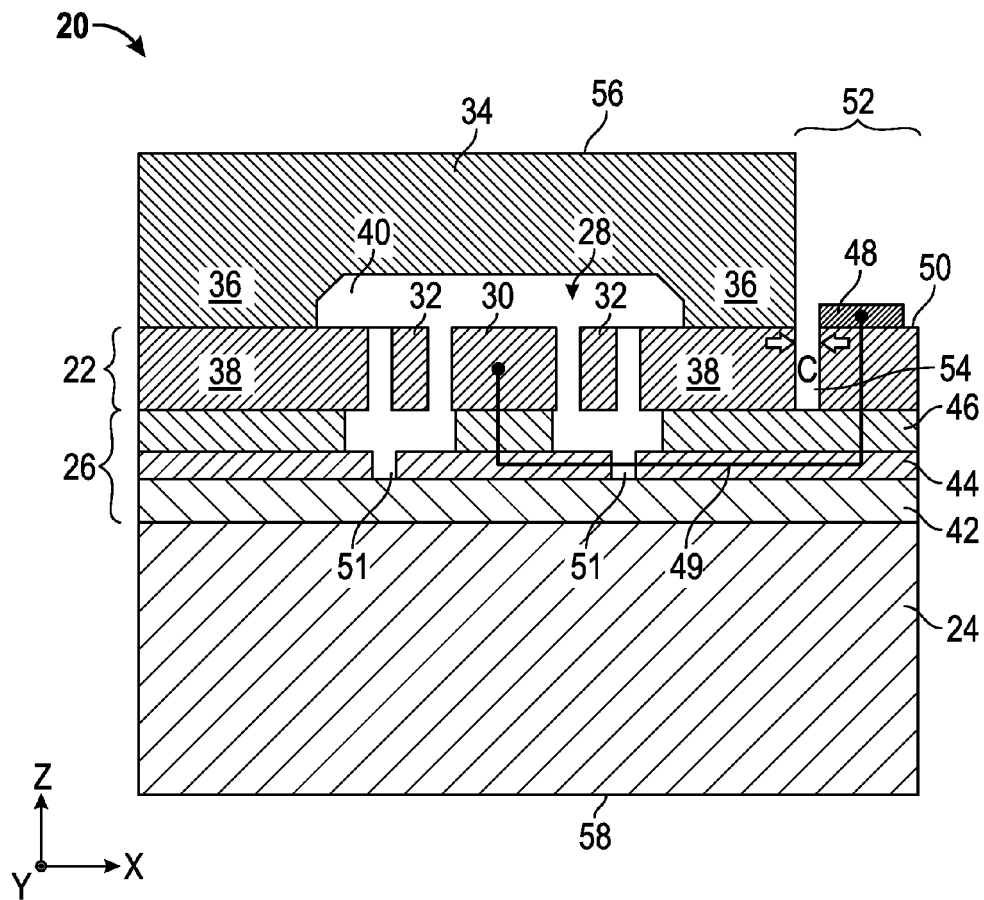
FIG. 1 is a simplified cross-sectional view of a MEMS device including a laterally-projecting bond pad shelf supporting a row of bond pads, as illustrated in accordance with the teachings of prior art.

For simplicity and clarity of illustration, the drawing figures illustrate the general manner of construction and may omit depiction, descriptions, and details of well-known features and techniques to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose. Finally, as still further appearing herein, terms such as "over," "under," "on," and the like are utilized to indicate relative position between two structural elements or layers and not necessarily to denote physical contact between structural elements or layers. Thus, a structure or layer may be described as fabricated "over" or "on" a substrate without indicating that the structure or layer necessarily contacts the substrate due to, for example, presence of one or more intervening layers.

FIG. 1 is a simplified cross-sectional view of a MEMS device 20 and, specifically, a capacitive-sensing MEMS accelerometer illustrated in accordance with the teachings of prior art. MEMS device 20 includes an electrically-conductive transducer layer 22 overlying a MEMS substrate 24. Transducer layer 22 may be fabricated utilizing a so-called "high density polycrystalline silicon" or, more simply" an "HD poly" fabrication process wherein a relatively thick layer of polycrystalline silicon is deposited over MEMS substrate 24 and then lithographically patterned to produce transducer layer 22. Fabrication of MEMS device 20 may be carried-out in parallel with the fabrication of a multitude of other MEMS devices by processing of a bulk silicon wafer or other workpiece. After a number of intervening layers 26 have been formed over the upper surface of the bulk silicon wafer, transducer layer 22 may be deposited and patterned to produce the desired transducer structure for each MEMS device. A cap wafer may then be bonded over the partially-fabricated MEMS devices and singulated to complete production of the MEMS devices and yield MEMS device 20 shown in FIG. 1.

In FIG. 1, MEMS transducer layer 22 is patterned to include a primary transducer structure 28 having a number of anchor regions 30 (one of which is shown in FIG. 1) fixedly joined to the underlying substrate 24. Anchor regions 30 are resiliently joined to a relatively large, movable body commonly referred to as a "proof mass" (hidden from view in FIG. 1) by a number of spring members 32, which may resemble elongated beams when viewed from a planform or top-down perspective. Spring members 32 suspend the proof mass above MEMS substrate 24 and are compliant in the axis or axes along which MEMS device 20 senses acceleration. Spring members 32 thus deflect to permit movement of the proof mass relative to anchor regions 30 and the other stationary MEMS structures in response to acceleration of MEMS device 20. A cover piece or MEMS cap 34 is sealingly positioned over an upper surface of transducer layer 22 to hermetically enclose the interior region of MEMS device 20 and prevent the environmental contamination thereof. MEMS cap 34 may include a lower circumferential wall or rim portion 36, which is bonded to an outer peripheral portion 38 of transducer layer 22, as generally shown in FIG. 1. A cavity 40 may be provided in the underside of MEMS cap 34 to prevent contact with transducer structure 28 and to accommodate the upward displacement of the proof mass in embodiments wherein MEMS device 20 senses acceleration along the Z-axis.

As noted above, intervening layers 26 are formed between the electrically-conductive MEMS transducer layer 22 and the underlying MEMS substrate 24. In the embodiment illustrated in FIG. 1, intervening layers 26 include: (i) a first dielectric layer 42 overlying MEMS substrate 24, (ii) an electrically-conductive interconnect layer 44 overlying dielectric layer 42, and (iii) a second dielectric layer 46 overlying interconnect layer 44. Layers 26 are patterned to define electrically-isolated interconnect lines connecting the sense electrodes of primary transducer structure 28 to a number of bond pads 48 located on the exterior of MEMS device 20. More specifically, electrically-conductive interconnect layer 44 may be patterned to define a number of interconnect lines, which are electrically isolated from each other by voids or air gaps 51 formed within interconnect layer 44 and electrically-isolated from the underlying MEMS substrate 24 by intervening dielectric layer 42. For purposes of illustration, one such interconnect line 49 is schematically shown in FIG. 1 as electrically coupling anchor region 30 of primary transducer structure 28 to the illustrated bond pad 48. Depending upon the particular design of MEMS device 20, interconnect layer 46 may also be patterned to define additional sense electrodes for monitoring changes in capacitance along the Z-axis. If electrically-conductive interconnect layer 44 is patterned to include one or more Z-sensing electrodes, such electrodes may likewise be electrically coupled to one or more bond pads provided on the exterior of MEMS device 20 by similar electrically-isolated interconnect lines.

Bond pads 48 are disposed on a bond pad shelf 50 located adjacent cap 34. Bond pad shelf 50 is formed by a laterally-projecting side portion of MEMS device 20 (in particular, an upper surface region of transducer layer 22), which extends beyond a sidewall of cap 34 in a lateral direction. Electrical isolation between bond pads 48 may be provided by etching the underlying portions of transducer layer 22 to define a number of individual pillars each surrounded by a circumferential clearance or air gap 54, each extending upward from dielectric layer 46 to support a different bond pad 48, and each connected to a different interconnect line formed in conductive layer 44. Bond pad shelf 50 and the bond pads 48 supported thereby are consequently located between the uppermost surface 56 of MEMS device 20 (the topside of MEMS cap 34) and the lowermost surface 58 of device 20 (the underside of substrate 24). In addition, a lateral clearance $C_1$ is typically provided between bond pads 48 and adjacent sidewall of MEMS cap 34 as bond pads 48 may initially be covered by the cap wafer from which MEMS cap 34 is formed and then exposed during fabrication utilizing a partial saw cut to remove area 52 from the cap wafer. While such a structural arrangement provides a workable device, the inclusion of bond pad shelf 50 increases the overall die size of MEMS device 20. Additionally, due to the relatively large step height between bond pad shelf 50 and the upper surface 56 of cap 34, MEMS device 20 is generally not amenable to Chip Scale Packaging (CSP) processes, such as Redistributed Chip Packaging (RCP) processes. As a result, wire bonding is typically required to form the desired electrical connections between MEMS bond pads 48 and the integrated circuit utilized to drive and monitor MEMS device 20 (not shown in FIG. 1).

The following describes methods of fabricating exemplary MEMS devices including one or more Through-Substrate-Vias ("TSVs"), which route electrical signals and/or voltages between the sense electrodes of the MEMS device and bond pads, interconnect lines, or other electrical conductors formed over the backside of the MEMS device. In so doing, embodiments of the below-described MEMS fabrication method enable the elimination of bond pad shelves, such as bond pad shelf 50 shown in FIG. 1, to minimize die size and reduce manufacturing costs of the MEMS devices. Advantageously, and by way of non-limiting example only, embodiments of the MEMS fabrication method described herein can be implemented as an improved HD poly MEMS fabrication process wherein a MEMS transducer structure is formed via the deposition and patterning of a layer of polycrystalline silicon. In such cases, non-penetrating via openings formed in the MEMS substrate may be filled with polycrystalline silicon during the HD poly deposition step to reduce manufacturing complexity and cost as compared to, for example, alternative manufacturing processes entailing separate via fill and polish steps. As a further advantage, embodiments of the below-described MEMS method enable the formation of embedded alignment features within the MEMS substrate, which may be utilized for photolithographical alignment after MEMS substrate thinning, as described more fully below.

FIGS. 2-14 are simplified cross-sectional views of a MEMS device 60 shown at various stages of completion and produced in accordance with an exemplary embodiment of the MEMS fabrication method. While an exemplary embodiment of the MEMS fabrication method will be described herein below primarily in conjunction with MEMS device 60 to provide a convenient, but non-limiting example, it is emphasized that embodiments of the MEMS fabrication method can be utilized to produce various different types of MEMS devices, which may differ in structure and function as compared to MEMS device 60. Furthermore, while MEMS device 60 is well-suited for usage as an accelerometer and may consequently be described below as such, it is emphasized the MEMS device produced pursuant to the below-described method are by no means limited to implementation as accelerometers. Rather, the fabrication methods described herein can be utilized to produce other types of MEMS sensor and actuators including, but not limited to, gyroscopes, magnetometers, pressure sensors, oscillators, and the like. Finally, the fabrication steps described below in conjunction with FIGS. 2-14 can be performed in alternative orders, certain steps may be omitted in alternative embodiments, and additional steps may be performed in alternative embodiments. Description of structures and fabrication processes known within the MEMS device and semiconductor industries may be limited or omitted entirely without providing the well-known process details.

Figure 2:
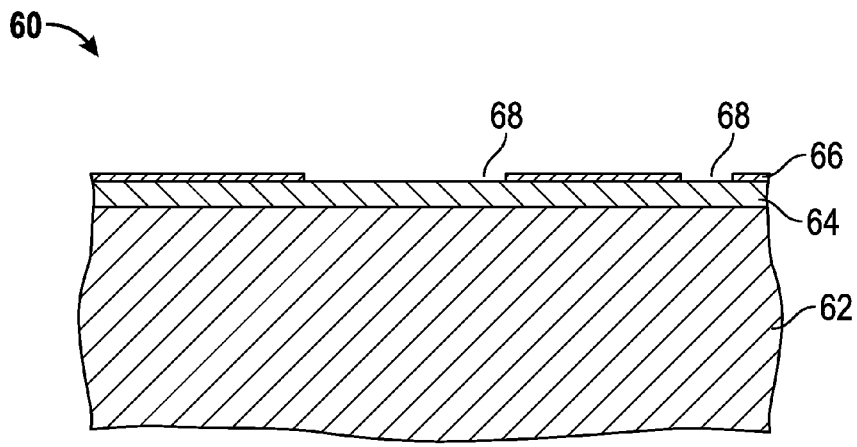
FIGS. 2-12 are simplified cross-sectional views of a MEMS devices shown at various stages of manufacture and including one or more Through-Substrate Vias ("TSVs"), as illustrated in accordance with an exemplary and non-limiting embodiment of the present invention.

With initial reference to FIG. 2, the exemplary MEMS manufacturing method commences with the provision of a MEMS substrate 62. MEMS substrate 62 may comprise any substrate on which MEMS device 60 can be fabricated including, for example, multi-layer substrates (e.g., Silicon-On-Insulator or "SOI" substrates), substrates composed of non-silicon semiconductor materials, and substrates composed of materials other than semiconductor materials. This notwithstanding, MEMS substrate 62 is preferably composed of silicon or a silicon-containing material. For example, substrate 62 may be a single crystal silicon substrate produced by singulation of a bulk silicon wafer. In this case, multiple MEMS devices may be simultaneously fabricated in parallel on a bulk silicon substrate, which is later singulated to produce the completed MEMS device and separate MEMS substrate 62 from the larger silicon wafer. The fabrication method depicted in conjunction with FIGS. 2-14 depicts only a limited portion of a single MEMS device, however, for ease of illustration and description.

In embodiments wherein MEMS substrate 62 is composed of silicon or another electrically-conductive material, a dielectric layer 64 may be formed over the upper surface of substrate 62. Dielectric layer 64 may be, for example, an oxide layer grown over the upper surfaces of substrate 62 utilizing a thermal oxidation process. In one embodiment, dielectric layer 64 is grown to thickness of about 2 microns (μm). After formation of dielectric layer 64, an electrically-conductive interconnect layer 66 is deposited or otherwise formed over the upper surface of dielectric layer 64. After deposition, interconnect layer 66 is lithographically patterned to define a plurality of electrically-isolated interconnect lines separated by air gaps or voids 68. In embodiments wherein MEMS device 60 is designed to sense acceleration along the Z-axis, electrically-conductive interconnect layer 66 may also be patterned to define one or more sense electrodes, which underlie the proof mass of subsequently-formed transducer structure 98 (described below). In one embodiment, electrically-conductive interconnect layer 66 is formed via the deposition of polycrystalline silicon utilizing a chemical vapor deposition (CVD) or physical vapor deposition (PVD) process. Interconnect layer 66 may be deposited to thickness of about 0.3 μm, although layer 66 may be thicker or thinner in other embodiments.

Figure 3:
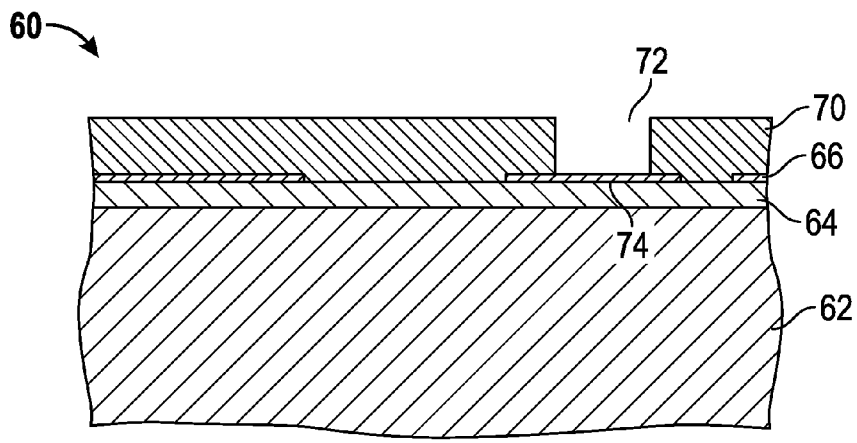
Figure 4:
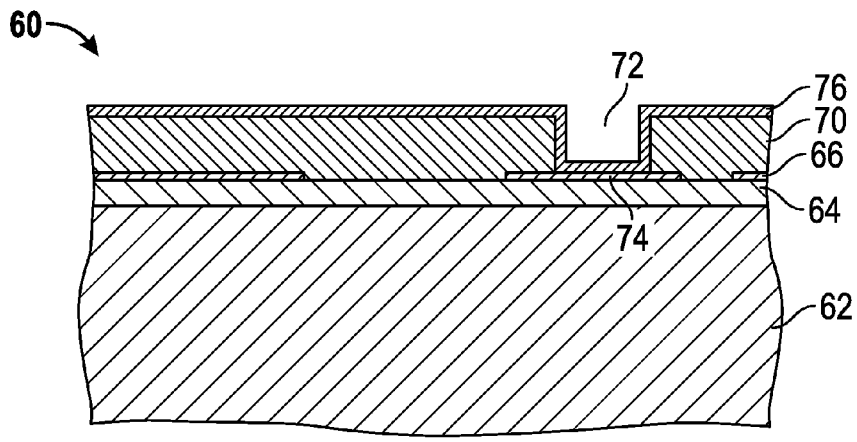

Next, as shown in FIG. 3, a sacrificial layer 70 is formed over the newly-patterned interconnect layer 66. Sacrificial layer 70 may be, for example, a sacrificial oxide deposited over the upper surface of interconnect layer 66. In one embodiment, sacrificial layer 70 is a silicon oxide deposited utilizing a low temperature Plasma-Enhanced CVD or Low Pressure CVD with a silane ($SiH_4$) or tetraethylorthosilicate ($Si(OC_2H_5)_4$ or "TEOS") source. Sacrificial layer 70 may be deposited to a thickness of, for example, about 2 μm. After deposition of layer 70, sacrificial layer 70 is patterned to form one or more contact openings 72 therethrough, which expose selected regions of the interconnect lines formed by the patterning of interconnect layer 66. The portion of MEMS device 60 shown in FIG. 3 includes one such contact opening 72, which extends through sacrificial layer 70 to expose an underlying interconnect line 74 included within interconnect layer 66. After patterning of sacrificial layer 70, an oxidation mask layer is formed over sacrificial layer 70 and the regions of interconnect layer 66 exposed through contact openings 72. FIG. 4 illustrates partially-fabricated MEMS device 60 after the deposition of a relatively thin oxidation mask layer 76 over the upper surfaces of patterned sacrificial layer 70, the sidewalls of layer 70 defining contact openings 72, and the portions of interconnect layer 66 exposed through contact openings 72. In one embodiment, oxidation mask layer 76 (referred to as "oxidation mask 76" herein below) is formed by depositing a layer of silicon nitride to a thickness of, for example, about 0.1 μm. In certain embodiments, a thin layer of oxide (e.g., an oxide layer (e.g., about 0.01 to about 0.05 μm) may be formed by oxidation or deposition over the regions of interconnect layer 66 exposed through contact openings 72 prior to deposition of oxidation mask layer 76 to provide stress release and/or to prevent undesired interaction between the material from which interconnect layer 66 is formed (e.g., polysilicon) and the material from which oxidation mask layer 76 is formed (e.g., silicon nitride).

Figure 5:
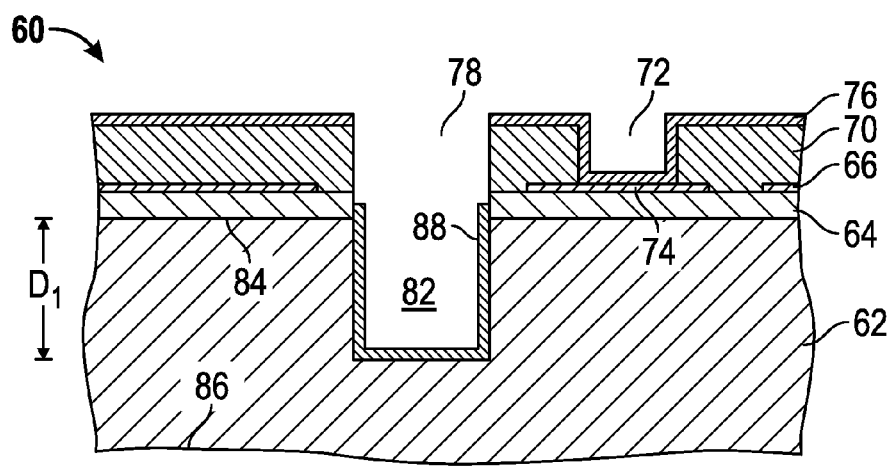

One or more via openings are next etched or otherwise formed in partially-fabricated MEMS device 60. FIG. 5 illustrates MEMS device 60 after the formation of one such via opening 82 extending through oxidation mask 76, through sacrificial layer 70, through dielectric layer 64, and into MEMS substrate 62. In this example, via opening 82 (and the other non-illustrated via openings) extends a predetermined depth $D_1$ into substrate 62 from an upper or top surface 84 thereof, but does not extend to underside 86 to fully penetrate substrate 62. Via openings 82 may be formed utilizing any material removal process suitable for forming high aspect ratio features including, for example, Deep Reactive Ion Etch (DRIE) processes. The particular dimensions of via openings 82 will vary amongst embodiments. However, by way of example, via openings 82 may be formed to each have a depth of about 200 to about 350 μm, as measured from an upper surface 84 of MEMS substrate 62; a lateral width (taken along the plane of the page in FIG. 5 or along the X-axis in FIG. 12) between about 5 and about 100 μm and, more preferably, between about 10 and about 50 μm; and a length (taken into the page in FIG. 5 or along the Y-axis in FIG. 12) between about 5 and about 100 μm and, more preferably, between about 10 and about 50 μm.

Figure 6:
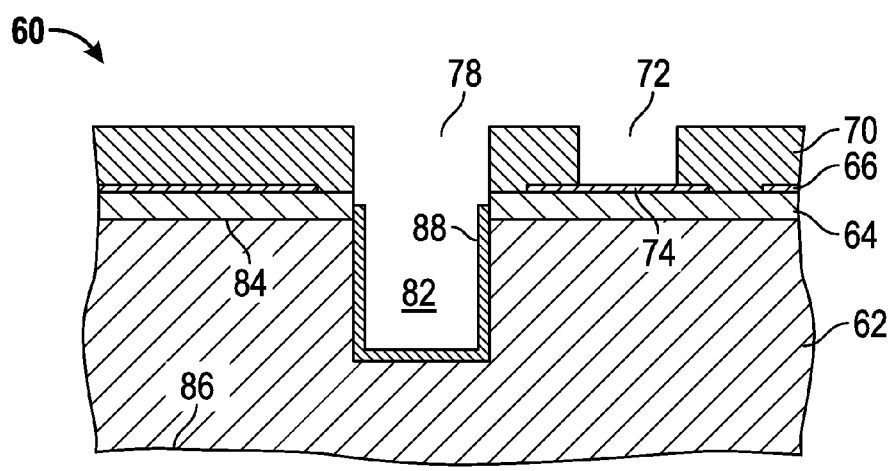

After the formation of via openings 82, a dielectric film 88 (referred to herein as the "via isolation liner 88") may be formed over the inner surfaces of via opening 82 to provide electrical isolation from MEMS substrate 62 in embodiments wherein substrate 62 is composed of silicon or another electrically-conductive material. The resultant structure is shown in FIG. 5. In one embodiment, via isolation liner 88 is formed as an oxide thermally grown to a thickness of, for example, about 2 μm. In embodiments wherein MEMS substrate 62 is composed of silicon, via isolation liner 88 will grow as silicon oxide over the exposed surfaces of substrate 62 and, specifically, the inner surfaces of substrate 62 defining the sidewalls and floor of each via opening 82. Oxidation mask 76 prevents undesired oxide growth over interconnect line 74, which may likewise be composed of silicon, and any other regions of patterned interconnect layer 66 that would be exposed through patterned sacrificial layer 70 if mask 76 were not provided. Oxidation mask 76 may be removed after the formation of via isolation liner 88, as shown in FIG. 6. Removal of mask 76 may be carried-out utilizing a wet or dry etch selective to the material form which mask 76 is formed. For example, in embodiments wherein oxidization mask 76 and liner 88 are composed of a nitride and an oxide, respectively, mask 76 may be removed by exposure to a wet etchant having chemistry selective to nitride over oxide, such as a phosphoric acid ($H_3PO_4$) etch solution.

Figure 7:
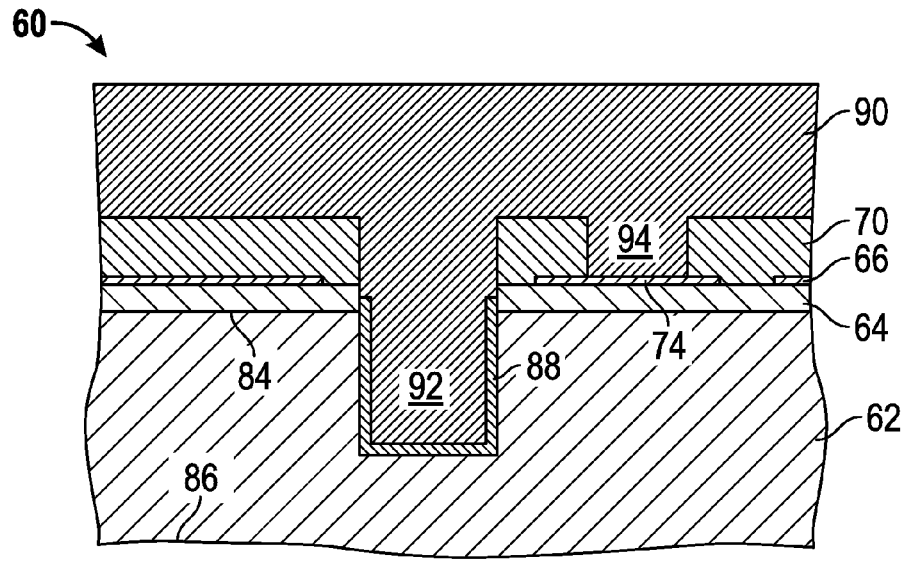

Referring now to FIG. 7, a body of electrically-conductive material 90, 92, 94 is next deposited over the upper surface of partially-fabricated MEMS device 20, into contact openings 72, and into via openings 82. Deposition of the body of electrically-conductive material 90, 92, 94 results in the formation of an unpatterned transducer layer 90 and the filling the via openings and the contact openings; the term "filled," as utilized in this context, denoting that a sufficient quantity of electrically-conductive material has been introduced into a contact or via opening to provide an electrically-conductive path therethrough. Thus, in some embodiments, via openings 92 may be partially filled or plated with an electrically-conductive material, such as polysilicon or a metal; however, in preferred embodiments, via openings 82 are filled with an electrically-conductive material in their substantial entirety and, more preferably, openings 82 are completely filled with polysilicon. With reference to the portion of MEMS device 60 shown in FIG. 7, specifically, via opening 82 has been filled with the electrically-conductive material to yield a filled, electrically-conductive via 92. Via 92 is buried at this juncture in the manufacturing process; that is, the lower terminal end of via 92 has not yet been exposed through the bottom surface of MEMS substrate 62 to produce a TSV extending entirely through substrate 62. Deposition of the body of electrically-conductive material 90, 92, 94 has also resulted in the filling of contact opening 72 (labeled in FIG. 6) and the formation of an electrically-conductive plug or contact 94, which extends through sacrificial layer 70 to provide ohmic contact to interconnect line 74. The body of electrically-conductive material 90, 92, 94 is preferably formed as an in-situ doped polysilicon deposited in an epitaxial or furnace reactor. By way of non-limiting example, unpatterned transducer layer 90 may be deposited to a thickness of, for example, about 5 to about 35 µm. If desired, a Chemical Mechanical Planarization (CMP) process can be utilized to remove any overburden and impart transducer layer 90 with a predetermined thickness. Notably, the efficiency of the MEMS fabrication process is improved by utilizing such a common fill deposition process to fill both contact openings 72 and via openings 82, while simultaneously forming unpatterned transducer layer 90.

Figure 8:
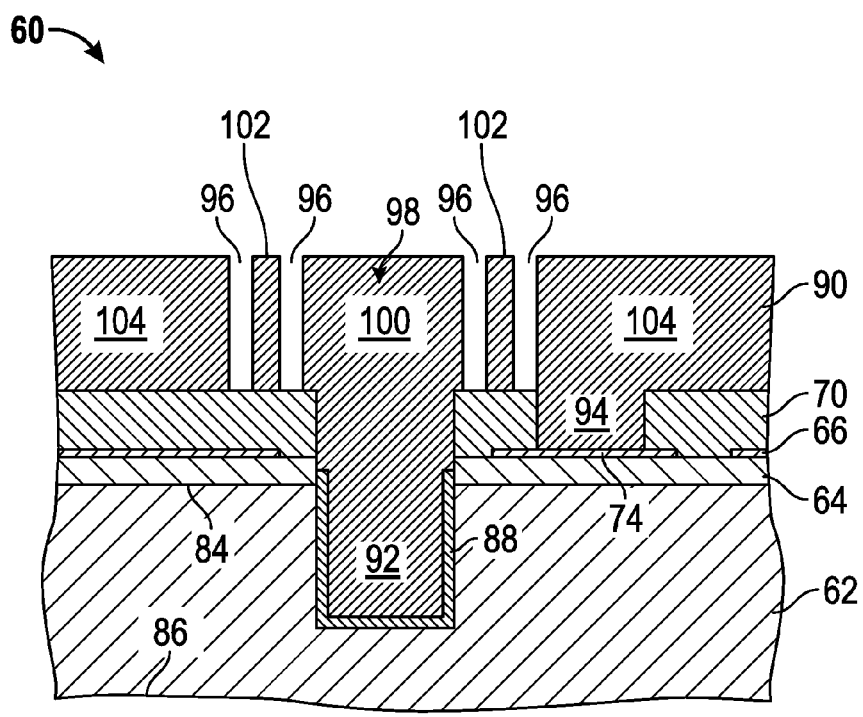
Figure 9:
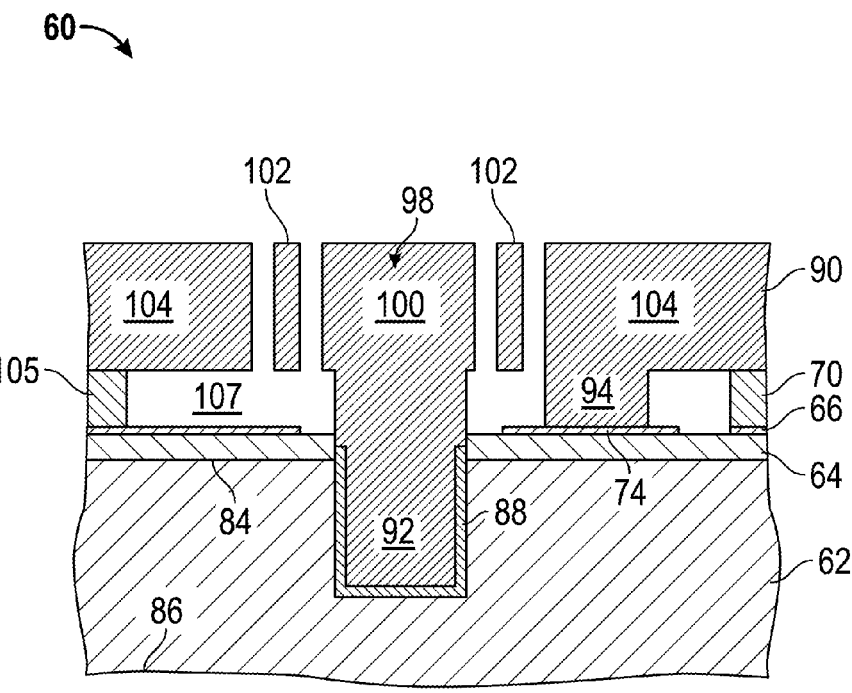

Advancing to FIG. 8, transducer layer 90 is patterned to form a number of openings 96 therethrough defining the primary transducer structure 98. The primary transducer structure 98 includes a number of anchor regions 100 mechanically joined to one or more proof mass structures (hidden from view in FIG. 8) by way of spring members 102. In the illustrated example, transducer layer 90 is also patterned to include a peripheral rim region 104, which extends around and circumferentially encloses the primary transducer structure 98. At this juncture of the manufacturing process, movement of the proof mass and spring members 102 is prevented or impeded by underlying sacrificial layer 70. Sacrificial layer 70 is thus removed, in whole or in part, to mechanically release the proof mass structure and spring members 102. Sacrificial layer 70 is conveniently removed through transducer layer openings 96 utilizing an etchant having a chemistry selective to the parent material of layer 70; e.g., in embodiments wherein sacrificial layer 70 is composed of a silicon oxide, a wet etch or vapor-based etch utilizing a fluoride-based etch chemistry may be employed. The resultant structure is shown in FIG. 9 wherein void area 107 has been produced via the removal of sacrificial layer 70 thereby mechanically releasing spring members 102 and the non-illustrated proof mass structure. A peripheral portion 105 of sacrificial layer 70 has, however, intentionally been left intact underlying peripheral rim region 104 of transducer layer 90 to facilitate hermetic sealing of MEMS device 60, as described more fully below in conjunction with FIG. 10.

Figure 10:
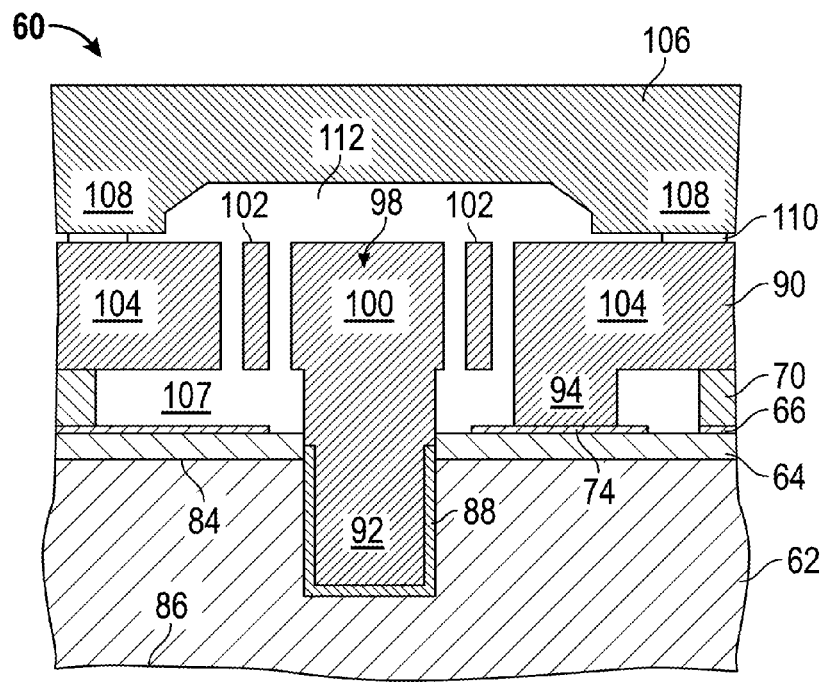

FIG. 10 illustrates partially-fabricated MEMS device 60 after attachment of a cover piece (referred to herein as "MEMS cap 106"). As shown in FIG. 10, MEMS cap 106 includes a lower circumferential wall or rim portion 108, which is sealingly joined to an outer peripheral portion 104 of transducer layer 90; e.g., in an embodiment, rim portion 108 of MEMS cap 106 may be bonded to peripheral portion 104 of transducer layer 90 utilizing an adhesive 110. As taken around the perimeter of MEMS device 60, rim portion 108 of MEMS cap 106 and peripheral portion 104 of transducer layer 90 are continuous or unbroken structures. Thus, rim portion 108 of MEMS cap 106, peripheral portion 104 of transducer layer 90, and the remaining peripheral portion of sacrificial layer 70 cooperate to hermetically enclose the interior region of MEMS device 60, which houses primary transducer structure 98, to prevent environmental contamination thereof. An inner depression or cavity 112 may be formed in the underside of MEMS cap 106 to accommodate deflection of the proof mass of primary transducer structure 98 along the Z-axis (upward in the illustrated orientation). MEMS cap 106 may be produced from a discrete cap wafer, which is bonded to the MEMS wafer and subsequently singulated to define cap 106 along with a number of similar caps bonded to neighboring MEMS devices produced in parallel with MEMS device 60. This example notwithstanding, MEMS device 60 need not include a cover piece or cap in all embodiments.

Figure 11:
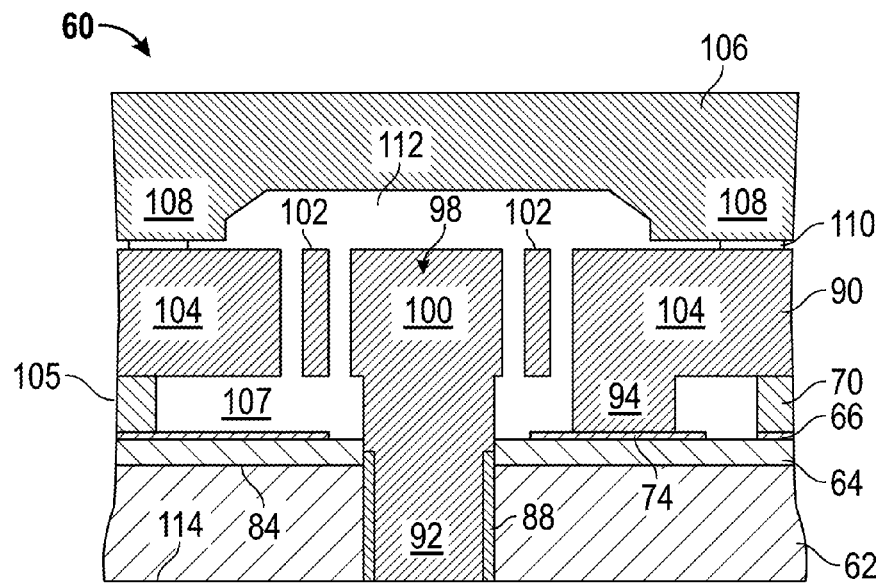

After attachment of MEMS cap 106 (FIG. 10), MEMS substrate 62 is thinned to reveal or expose vias 92 through a bottom surface thereof and thereby produce a number of TSVs extending entirely through substrate 62. FIG. 11 illustrates partially-fabricated MEMS device 60 after thinning of MEMS substrate 62 and exposure of the illustrated via 92 through a newly-formed bottom surface 114 thereof. A lower portion of via liner 88 is also removed during substrate thinning to ultimately expose the lower region of via 92 and the other non-illustrated vias. During the thinning process, sufficient material may be removed from the backside of MEMS substrate 62 to impart substrate 62 with a predetermined final thickness of, for example, about 100 to about 300 µm. While any process or combination of processes suitable for removal material from the backside of MEMS substrate 62 to reveal the vias therethrough can be employed, grinding is preferably utilized to thin MEMS substrate 62. In alternative embodiments, substrate 62 may be ground or otherwise thinned prior to attachment of MEMS cap 106, if included within MEMS device 60; however, it is preferred that MEMS substrate 62 is thinned after MEMS cap attachment to structurally reinforce the partially-fabricated MEMS device during the thinning process.

Figure 12:
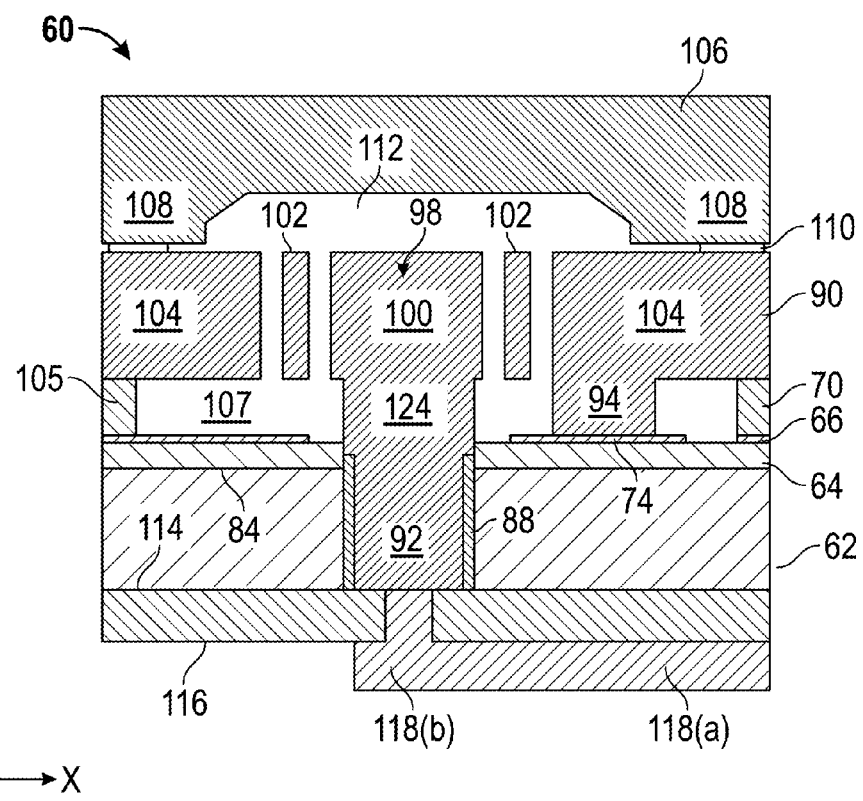

Continuing with the exemplary MEMS fabrication process, one or more electrically-conductive contacts (generically referred to herein as "backside conductors") are next formed over the backside 114 of MEMS substrate 62. With reference to FIG. 12, a backside dielectric layer 116 may first be formed over bottom surface 114 of thinned MEMS substrate 62 utilizing, for example, a CVD, PVD, or spin-on deposition process. Backside dielectric layer 116 may then be lithographically patterned to expose vias 92 therethrough. As vias 92 now extend fully through substrate 62, vias 92 are referred to as "TSVs 92" hereafter. An electrically-conductive layer 118 (e.g., copper or another metal) may then be deposited over dielectric layer 116 and patterned to form a number of bond pads 118(a). Bond pads 118(a) may be in direct ohmic contact with TSVs 92 and, consequently, interconnect lines may be unnecessary in certain embodiments. However, bond pads 118(a) will often not align or be vertically offset with respect to TSVs 92, as taken along the Z-axis in FIG. 12. Consequently, additional backside conductors may also be formed to interconnect bond pads 118(a) with their associated TSVs 92. For example, as shown in FIG. 12, electrically-conductive layer 118 may further be patterned to include at least one interconnect line 118(b) (also considered "backside conductors"), which extends over the backside of MEMS substrate 62 to electrically connect the illustrated TSV 92 with the illustrated bond pad 118(a). If desired, a passivation dielectric layer can be formed, for example, utilizing CVD, PVD, or a spin-on method and patterned as optional steps to protect the metal layers from scratching or other physical damage. Conventional manufacturing steps may then be carried-out to complete fabrication and packaging of MEMS device 60 including, for example, electrical interconnection of MEMS device 60 with neighboring integrated circuit (IC), which may be encapsulated with MEMS device 60 in a common package. As bond pads 118(a) are located at an elevation substantially equivalent to the elevation of the bottom most surface of MEMS device 60, MEMS device 60 is well-suited for interconnection to, for example, a printed circuit board utilizing a CSP packaging technique. Such packaging approaches include both 2D and 3D (stacked) packaging approaches, such as Flip Chip (FC) Package-on-Package (PoP), Thru Mold Via (TMV) FC PoP, and RCP PoP packaging approaches.

It should thus be appreciated that backside bond pads 118(a) are formed over the bottom or lower surface 114 of MEMS substrate 62 in the case of the exemplary MEMS device 60 (FIG. 12) produced as a result of the above-described fabrication process. As a result, embodiments of MEMS device 60 are not required to include a laterally-projecting bond shelf to support bond pads 118(a); although, in some embodiments, MEMS device 60 may include one or more bond pad shelves in addition to the TSVs. In embodiments wherein MEMS device 60 lacks any such bond shelf and assuming device 60 to have a generally rectangular planform shape, the four lateral sides of MEMS cap 106 may be substantially vertically flush with the four lateral sides of transducer layer 90, substrate 62, and the other layers of MEMS device 60, as shown in FIG. 12. Relative to a comparable MEMS device including a laterally-projecting bond shelf, such as bond shelf 50 of MEMS device 20 shown in FIG. 1, the footprint of MEMS die is consequently reduced by a significant margin. More specifically, a die size reduction of about 15% to about 30% can be achieved in certain implementations. Through this reduction in die size, cost savings are also realized, which may render the above-described fabrication method cost neutral or less costly to performed as compared to conventional MEMS fabrication methods. Furthermore, by relocating the MEMS bond pads to the underside of the MEMS substrate 62, fewer spatial constraints are placed the positioning or arrangement of the bond pad array as compared to conventional bond-shelf architectures. As a still further advantage, MEMS device 60 is amenable to RCP packaging and CSP packaging techniques as bond pads 118(a) of MEMS device 60 are disposed on the lowermost surface of device 60.

Figure 13:
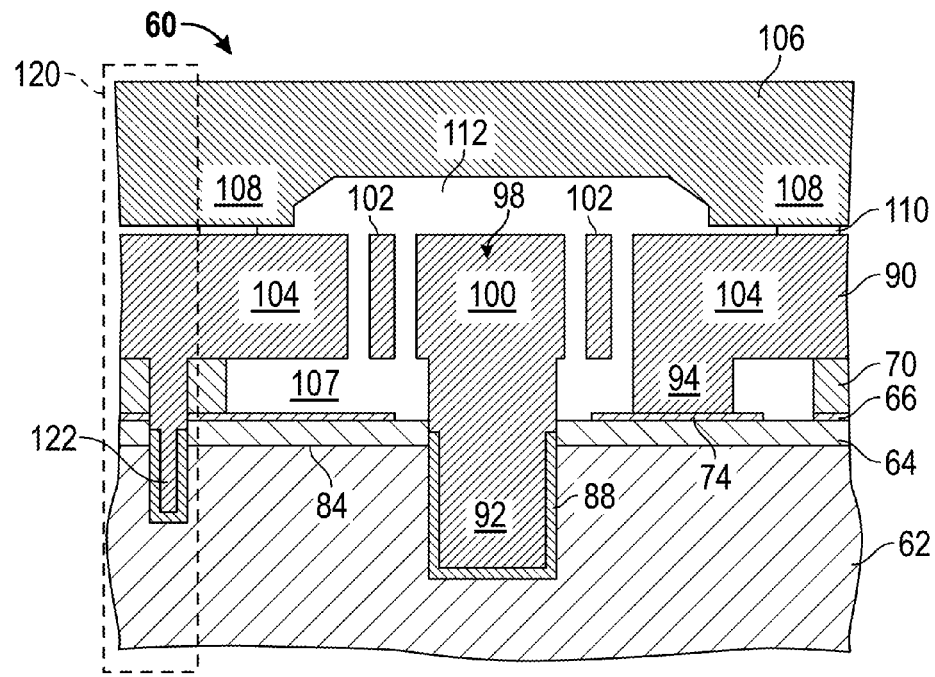
FIGS. 13 and 14 are simplified cross-sectional view of the MEMS device shown in FIGS. 2-12 in a partially-completed state and illustrating one manner in which photolithographical alignment features can be formed in parallel with the TSVs in certain implementations of the MEMS fabrication method.
Figure 14:
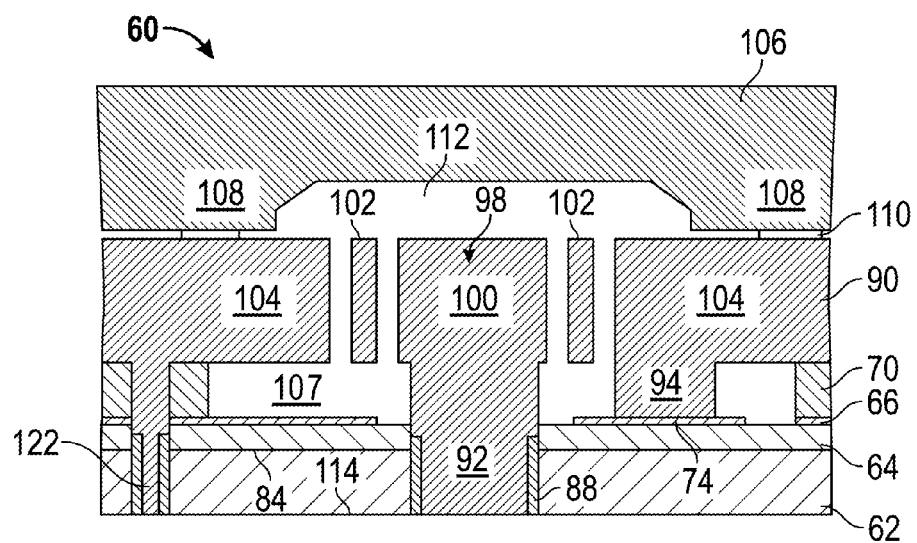

The above-described MEMS manufacturing technique can also be utilized to form photolithographical alignment features on the backside of the ground or thinned MEMS substrate in conjunction with formation of the TSVs. This may be more fully appreciated by referring to FIG. 13, which illustrates MEMS device 60 prior to substrate thinning and prior to singulation. FIG. 13 is identical to FIG. 10 with the exception that a larger portion of the partially-fabricated MEMS device 60 is shown, as encompassed by dashed box 120 shown in the leftmost portion of FIG. 13. Here, MEMS device 60 has been fabricated to further include an embedded alignment feature 122, which extends into MEMS substrate 62 to a depth substantially equivalent to the illustrated via 92. Alignment feature 122 can be fabricated in parallel with via 92 utilizing the above-described process by further patterning MEMS device 60 to include one or more additional alignment feature openings extending into, but not through MEMS substrate 62. Such openings may then be filled during the above-described transducer layer deposition step along with filling of the via openings and the contact openings (e.g., via opening 82 and contact opening 72 shown in FIG. 5). During the above-described back-grinding or thinning process, and as illustrated in FIG. 13, alignment features 122 may be exposed along with vias 92 to provide convenient points of reference with which to align the lithographical tools utilized for patterning of layers 116 and 118. When viewed from a top-down or planform perspective, the particular design or shape of alignment features 122 will vary depending upon the requirements of the tool. Common alignment structure designs include circular shapes, annular shapes, frames, and rectangular shapes, to list but a few examples. So as to not unnecessarily increase the footprint of the finished MEMS device, alignment features 122 are preferable formed within the dicing streets or kerf areas removed from MEMS device 60 during dicing, as indicated in FIG. 13 by dashed box 120.

There has thus been provided methods of fabricating an exemplary MEMS device including one or more TSVs, which enable the elimination of the bond pad shelf, in at least some embodiments, to bring about favorable reductions in die size and manufacturing costs. In preferred embodiments, the MEMS fabrication method described above are implemented as a modified HD poly process flow wherein via poly fill and the HD poly deposition step are simultaneously accomplished during a single manufacturing step to reduce cost as compared to, for example, alternative manufacturing processes entailing separate via fill and polish steps. Additionally, embodiments of the MEMS fabrication method facilitate the formation of photolithographical alignment features on the backside of the ground or thinned MEMS substrate in conjunction with formation of the TSVs. While at least one exemplary embodiment of the MEMS fabrication method has been provided above, numerous variations of this method are possible. For example, in one possible variation wherein the MEMS device does not include Z-axis electrodes defined by patterning of an interconnect layer, the interconnect layer (e.g., interconnect layer 66 shown in FIGS. 2-14) and its associated dielectric layer (e.g., dielectric layer 64 shown in FIGS. 2-14) can potentially be eliminated with the desired interconnections provided solely utilizing backside routing.

In one embodiment, the above-described MEMS device fabrication method depositing a sacrificial layer over a top surface of a substrate. A via opening is etched or otherwise formed, which extends through the sacrificial layer and into the substrate. A body of electrically-conductive material is deposited over the sacrificial layer and into the via opening to produce an unpatterned transducer layer and a via in ohmic contact with the unpatterned transducer layer. The unpatterned transducer layer is then patterned to define, at least in part, a primary transducer structure. At least a portion of the sacrificial layer is removed to release at least one movable component of the primary transducer structure. The substrate is thinned to reveal or expose the via through a bottom surface thereof and thereby produce a TSV. A backside conductor, such as a bond pad, is then produced over the bottom surface of the substrate and electrically coupled to the exposed via.

In another embodiment, the MEMS fabrication method the step of etching a via opening into a substrate. A body of polycrystalline silicon is deposited over the substrate and into the via opening so as to produce an unpatterned transducer layer and a via electrically coupled thereto. The unpatterned transducer layer is then patterned to define, at least in part, a primary transducer structure. A MEMS cap is positioned over the primary transducer structure, and a backside of the substrate is ground to reveal or expose the via therethrough. A bond pad is then produced on ground backside of the substrate electrically coupled to the newly-exposed via.

The foregoing has further provided embodiments of a MEMS device including a substrate (e.g., a singulated piece of a silicon wafer), a patterned transducer layer formed over a top surface of the substrate, a backside bond pad formed over a bottom surface of the substrate, and a filled TSV extending through the substrate to electrically couple at least one region of the patterned transducer layer to the backside bond pad. An interconnect line may also be formed over the backside or bottom surface of the MEMS substrate to electrically couple the filled TSV to the backside bond pad when the filled TSV and backside bond pad do not vertically align; that is, do not overlap as taken along an axis orthogonal to the bottom surface of the substrate (e.g., the Z-axis in FIG. 12). The TSV may be integrally formed with the patterned transducer layer as a commonly-deposited body of polycrystalline silicon; that is, a body of polycrystalline silicon deposited as a single mass or in a single, continuous deposition process. Notably, a MEMS device including such a commonly-deposited body of polycrystalline silicon may be distinguished from a MEMS device wherein one or more TSVs are produced utilizing a deposition process that is separate and discrete from the deposition process utilized to form the transducer layer by cross-sectioning and microscopic inspection of variance in morphology (e.g., the grain structure) at the interface between the filled TSV(s) and the overlying transducer layer. Additionally, in embodiments wherein a common fill process is utilized to form the TSVs and the unpatterned transducer layer, the neck portion of the deposited electrically-conductive (e.g., polysilicon) body; e.g., in FIG. 12, the neck portion 124 of the electrically-conductive body located between transducer layer 90 and filled TSV 92 and surrounded by a circumferential clearance including within voided area 107) will typically have a width that is greater than or equal to the width of TSV 92, as indicated in FIG. 12. In certain embodiment, the MEMS device may further include electrical interconnects formed over the backside of the substrate and electrically interconnecting the newly-exposed vias with their corresponding backside bond pads, as previously described.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention, as set-forth in the appended claims.

What is claimed is:

1. A method of fabricating a Microelectromechanical Systems ("MEMS") device, comprising:
   forming an interconnect layer and an underlying dielectric layer on a substrate, the interconnect layer patterned to include at least one interconnect line;
   depositing a sacrificial layer over the interconnect layer;
   patterning the sacrificial layer to form a contact opening therein through which a portion of the interconnect line is exposed;
   forming a via opening extending through the sacrificial layer and into the substrate over which the sacrificial layer has been formed;
   depositing a body of electrically-conductive material over the sacrificial layer, into the contact opening, and into the via opening to simultaneously produce an unpatterned transducer layer, a contact integrally formed with the unpatterned transducer layer, and a via integrally formed with the unpatterned transducer layer, the unpatterned transducer layer electrically coupled to the interconnect line through the contact;
   patterning the unpatterned transducer layer to define, at least in part, a primary transducer structure having at least one movable component;
   removing at least a portion of the sacrificial layer to release the movable component of the primary transducer structure;
   thinning the substrate to reveal the via through a bottom surface of the substrate; and
   producing a backside conductor over the bottom surface of the substrate and electrically coupled to the via.

2. The method of claim 1 wherein depositing the body of electrically-conductive material comprises depositing a layer of polycrystalline silicon over the sacrificial layer, into the contact opening, and into the via opening.

3. The method of claim 1 further comprising forming a via dielectric liner over one or more interior surfaces of the substrate defining the via opening prior to depositing the body of electrically-conductive material over the sacrificial layer.

4. The method of claim 1 further comprising:
   forming an oxidation mask layer over an upper surface of the sacrificial layer and over the portion of the interconnect line exposed through the contact opening.

5. The method of claim 4 wherein the via opening is formed to extend through the oxidation mask layer, through the sacrificial layer, and into the substrate.

6. The method of claim 1 further comprising growing an oxide liner over one or more interior surfaces of the substrate defining the via opening prior to depositing the body of electrically-conductive material over the sacrificial layer.

7. The method of claim 1 further comprising attaching a MEMS cap over the primary transducer structure.

8. The method of claim 7 wherein thinning the substrate comprises grinding a backside of the substrate after attachment of the MEMS cap to impart the substrate with a predetermined thickness.

9. The method of claim 7 wherein removing comprises removing a central portion of the sacrificial layer to release the at least one movable component of the primary transducer structure, while leaving intact a peripheral portion of the sacrificial layer cooperating with the patterned transducer layer and the MEMS cap to hermetically enclose an interior of the MEMS device.

10. The method of claim 1 further comprising forming at least one embedded lithographical alignment feature extending into the substrate and visible through a backside of the substrate after thinning of the substrate.

11. The method of claim 10 wherein forming the at least one embedded lithographical alignment feature comprises:
    forming an alignment feature opening extending through the sacrificial layer and into the substrate; and
    depositing a fill material into the alignment feature opening to produce the embedded lithographical alignment feature within the substrate;
    wherein the embedded lithographical alignment feature is revealed through the bottom surface of the substrate along with the via after thinning of the substrate.

12. The method of claim 11 wherein the fill material comprises polycrystalline silicon, and wherein the alignment feature opening is filled, at least in substantial part, during deposition of the body of electrically-conductive material over the sacrificial layer and into the via opening.

13. The method of claim 1 wherein the backside conductor comprises a backside bond pad, and wherein the method further comprises forming at least one backside interconnect line over a backside of the substrate, the at least one backside interconnect line electrically coupling the backside bond pad to the via.

14. The method of claim 1 further comprising packaging the MEMS device utilizing a chip scale package after producing the backside conductor on a backside of the substrate and electrically coupled to the via.

15. A method of fabricating a Microelectromechanical Systems ("MEMS") device, comprising:
    depositing a sacrificial layer over an interconnect line formed on a substrate;
    patterning the sacrificial layer to form a contact opening through which a portion of the interconnect line is exposed;
    etching a via opening extending through the sacrificial layer and into the substrate from an upper surface of the substrate;
    depositing a body of polycrystalline silicon over the sacrificial layer, into the contact opening, and into the via opening to simultaneously produce an unpatterned transducer layer, a contact integrally formed with the unpatterned transducer layer, and a via integrally formed with the unpatterned transducer layer, the unpatterned transducer layer electrically coupled to the interconnect line through the contact;
    patterning the unpatterned transducer layer to define, at least in part, a primary transducer structure;
    attaching a MEMS cap over the primary transducer structure;
    grinding a backside of the substrate to produce a ground backside through which the via is exposed;
    producing a backside bond pad and a backside interconnect line on the ground backside of the substrate, the backside bond pad electrically coupled to the via by the backside interconnect line; and
    forming at least one embedded lithographical alignment feature extending into the substrate from the upper surface of the substrate, located in a kerf area, and visible through the ground backside of the substrate.

16. A method of fabricating a Microelectromechanical Systems ("MEMS") device, comprising:
    providing a dielectric layer overlying a substrate, an interconnect line overlying the dielectric layer, and a sacrificial layer overlying the interconnect line;
    patterning the sacrificial layer to form a contact opening through which a portion of the interconnect line is exposed;
    forming an oxidation mask layer over the sacrificial layer and over the portion of the interconnect line exposed through the contact opening;
    after forming the oxidation mask layer, forming a via opening extending through the sacrificial layer, through the oxidation mask layer, and into the substrate;
    removing the oxidation mask layer;
    after removing the oxidation mask layer, depositing a body of electrically-conductive material over the sacrificial layer, into the contact opening, and into the via opening to simultaneously produce an unpatterned transducer layer, a contact, and a via, respectively, wherein the via is in ohmic contact with the unpatterned transducer layer, and wherein the unpatterned transducer layer is electrically coupled to the interconnect line through the contact;
    patterning the unpatterned transducer layer to define, at least in part, a primary transducer structure having at least one movable component;
    removing at least a portion of the sacrificial layer to release the movable component of the primary transducer structure; and
    revealing the via through a bottom surface of the substrate.

* * * * *